United States Patent
Tabata et al.

(10) Patent No.: US 6,836,863 B2
(45) Date of Patent: Dec. 28, 2004

(54) SEMICONDUCTOR MEMORY TESTING METHOD AND APPARATUS

(75) Inventors: Makoto Tabata, Tokyo (JP); Noboru Okino, Tokyo (JP)

(73) Assignee: Advantest Corporation, Tokyo (JP)

( * ) Notice: Subject to any disclaimer, the term of this patent is extended or adjusted under 35 U.S.C. 154(b) by 543 days.

(21) Appl. No.: 09/925,138

(22) Filed: Aug. 8, 2001

(65) Prior Publication Data

US 2002/0054528 A1 May 9, 2002

(30) Foreign Application Priority Data

Aug. 11, 2000 (JP) ........................................ 2000-243965

(51) Int. Cl.[7] .............................................. G11C 29/00
(52) U.S. Cl. .................. 714/719; 714/723; 365/185.29; 365/201
(58) Field of Search ................................ 714/718–719, 714/723; 365/185.29, 201

(56) References Cited

U.S. PATENT DOCUMENTS 6,587,975 B2 * 7/2003 Mori et al. .................. 714/723

FOREIGN PATENT DOCUMENTS

| EP | 662692 A1 | * | 7/1995 | ........... G11C/16/06 |
| EP | 1041577 A1 | * | 10/2000 | ........... G11C/16/02 |

OTHER PUBLICATIONS

Chimenton, A.; Pellati, P.; Olivo, P.; Analysis of erratic bits in flash memories; Reliability Physics Symposium, 2001. Proceedings. 39th Annual. 2001 IEEE International , Apr. 30–May 2001 pp.: 17–22□□.*

Shirota, R. Test and repair of non–volatile commodity and embedded memories (NAND flash memory); ITC International Test Conference, 2002. Proceedings. International Publication Date: Oct. 7–10, 2002 p. 1221.*

Micron® Program and Erase Option; Micron Technical Note TN–28–37; pp. 1–2; Revised May 2002; Micron Technology Inc., Boise, ID 83707–006; available at http://download. micron.com/pdf/technotes/ft37.pdf.*

* cited by examiner

Primary Examiner—R. Stephen Dildine
(74) Attorney, Agent, or Firm—David N. Lathrop, Esq.; Gallagher & Lathrop (57) ABSTRACT

A memory block is subject to an erasure operation by a batch operation. Subsequently, a read-out test is conducted upon the memory block to count the number of unerased memory cells. If the count $F_N$ is equal to or greater than a given number $T_F$, a plurality of erasure operations are conducted consecutively next. If $F_N < T_F$, a single erasure operation is conducted next, subsequently followed by a read-out test. The erasure operations and the read-out tests are repeated.

13 Claims, 6 Drawing Sheets

PRIOR ART

SEMICONDUCTOR MEMORY TESTING METHOD AND APPARATUS

BACKGROUND OF THE INVENTION

The invention relates to a semiconductor memory, in particular, to a semiconductor memory testing method and apparatus which is used to determine whether a flash memory, in a preferred application, is acceptable or faulty.

Figure 1:
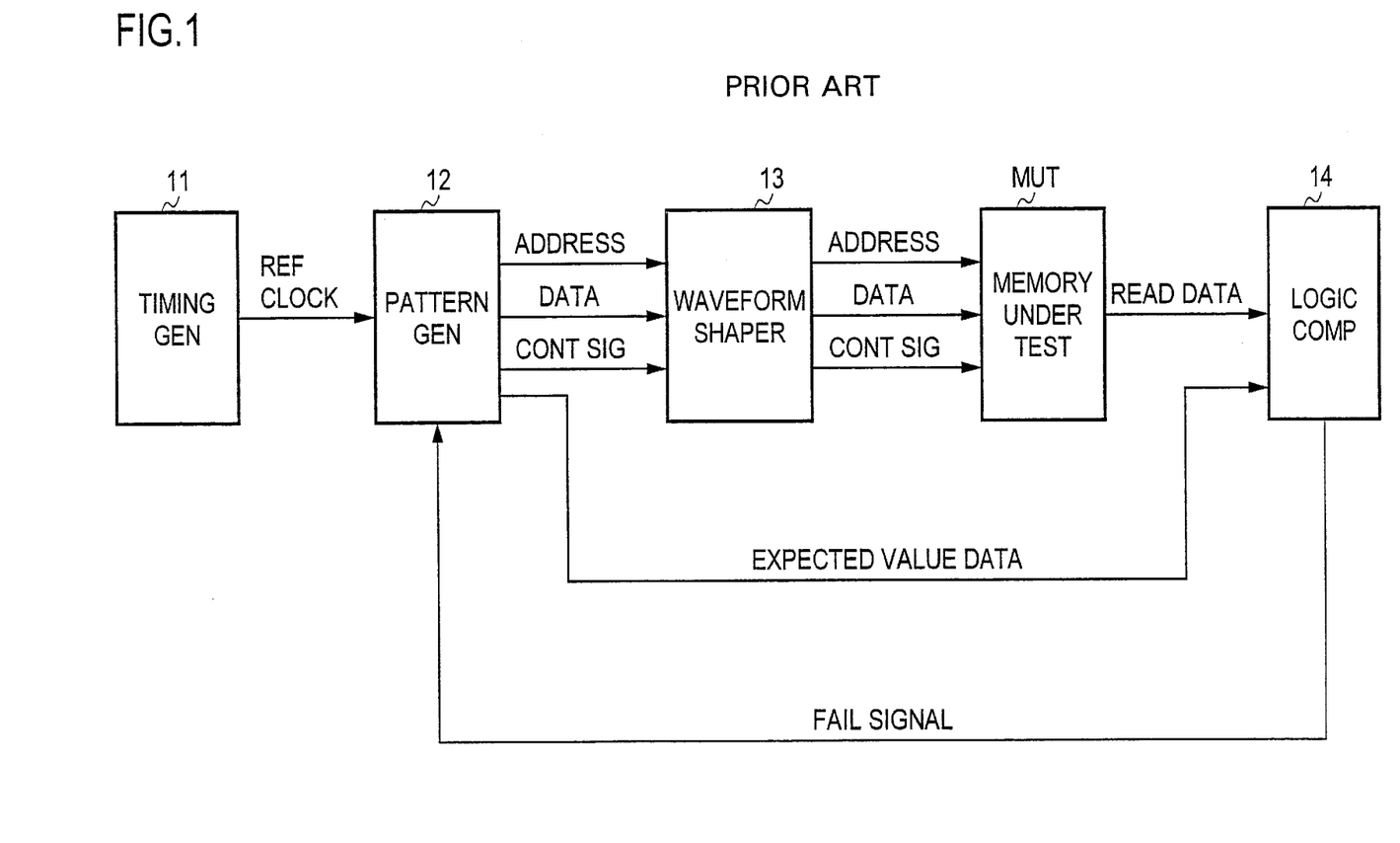
FIG. 1 is a block diagram illustrating an arrangement of a conventional semiconductor memory testing apparatus schematically.

FIG. 1 schematically illustrates a semiconductor memory testing apparatus which is commonly employed.

The semiconductor memory testing apparatus comprises a timing generator 11, a pattern generator 12, a waveform shaper 13, and a logic comparator 14 in order to test a memory under test MUT for a normal operation.

Specifically, the timing generator 11 generates a reference clock, which is used by the pattern generator 12 in developing address signal, test pattern data and control signals which are to be applied to the memory MUT. Initially, these signals are applied to the waveform shaper 13, which operates to shape them into waveforms which are required to conduct the test, and then are applied to the memory MUT.

The control signal controls a writing into or a read-out from the memory MUT of the test pattern data. Test pattern data which is read from the memory MUT is applied to the logic comparator 14 where the read data is compared against expected value data delivered from the pattern generator 12 to see if both match or do not match, thus determining whether the memory MUT is acceptable or faulty. The result of determination rendered is fed back to the pattern generator 12 to be used in aborting the test or in modifying a sequence of patterns generated.

Figure 2:
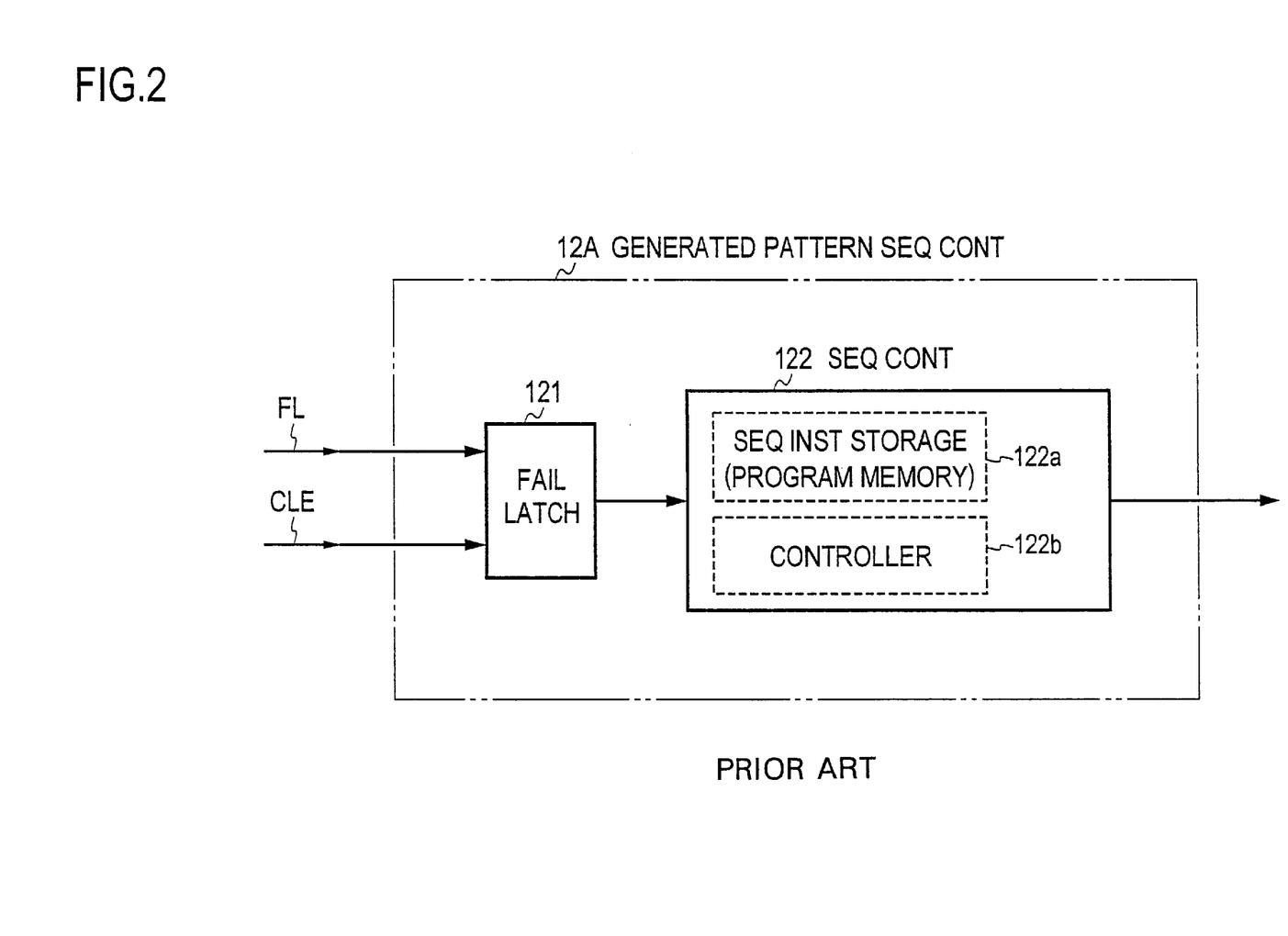
FIG. 2 is a block diagram illustrating a functional arrangement of a generated pattern sequence controller which is used in the semiconductor memory testing apparatus shown in FIG. 1.

The pattern generator 12 stores "fail" information sent from the logic comparator 14, and such "fail" information allows the sequence of patterns generated to be modified. A functional arrangement of a generated pattern sequence controller which is capable of modifying the sequence of patterns generated is schematically shown in FIG. 2.

Specifically, a generated pattern sequence controller 12A comprises a "fail" latch 121 and a sequence controller 122. "Fail" information FL and a clear signal CLE are input to the fail latch 121. Fail information FL is delivered from the logic comparator to be latched or stored in the fail latch 121. The clear signal CLE is effective to clear or erase the information latched in the fail latch 121. An instruction which causes the clear signal to be issued can be described in a pattern generating program at any cycle, and thus the clear signal can be issued at any cycle during the test cycle.

The sequence controller 122 comprises a storage (program memory 122a) containing a sequence instruction (a generated pattern sequence program) which allows the sequence of patterns generated to be modified in accordance with the fail information stored in the fail latch 121, and a controller 122b which executes a program in the storage.

A flash memory is one of varieties of semiconductor memory, and exhibits a non-volatile feature which retains its stored content if the power supply thereto is interrupted. The flash memory has an internal arrangement comprising a plurality of memory blocks, and can be erased in unit of a memory block or an entire chip by a batch operation. As termed herein, a semiconductor memory in which an entire chip is erased by a batch operation will be described as "a semiconductor memory comprising only a single memory block".

The flash memory is provided with a charging function for each memory cell, and this charging function allows the stored content to be maintained if the power supply is interrupted. As a result of the presence of such function, immediately after the manufacture, the flash memory contains memory cells having their charging functions which are aligned with each other in a normal manner and memory cells having their charging functions which are out of the normal range. Accordingly, the flash memory is subject to an erasure by a batch operation in unit of a block or an entire chip, thus bringing individual memory cells to their normal condition or a storage of logic "1". However, it is not assured that a single erasure operation can bring all of the memory cells to a normal condition.

For this reason, an erasure operation of a flash memory is conducted immediately after its manufacture, and is followed by a read-out test (confirmation test) which is intended to detect any memory cell which remains unerased (or offset from a normal condition). The combination of the erasure operation and the read-out test is referred to as an erase test, and is repeatedly conducted.

During the erase test, if memory cell is detected which remains unerased, the erasure operation is again conducted for the memory block which includes the cell, and a confirmation is again made to see the stored content of the cell. The erase operation and the confirmation operation are repeated until there is no memory cell which remains unerased. A memory block is determined to be "pass" (acceptable) if the erasure of all memory cells of the memory block is completed when the erase test is repeated within a prescribed number of repetitions. A memory block is described to be "fail" (faulty) if the erasure of memory cells of the block is not completed when the erase test is repeated the prescribed number of repetitions, and the procedure proceeds to testing a next memory block. Alternatively, if the memory block found to be "fail" is a last memory block to be tested, the test is terminated.

Figure 3:
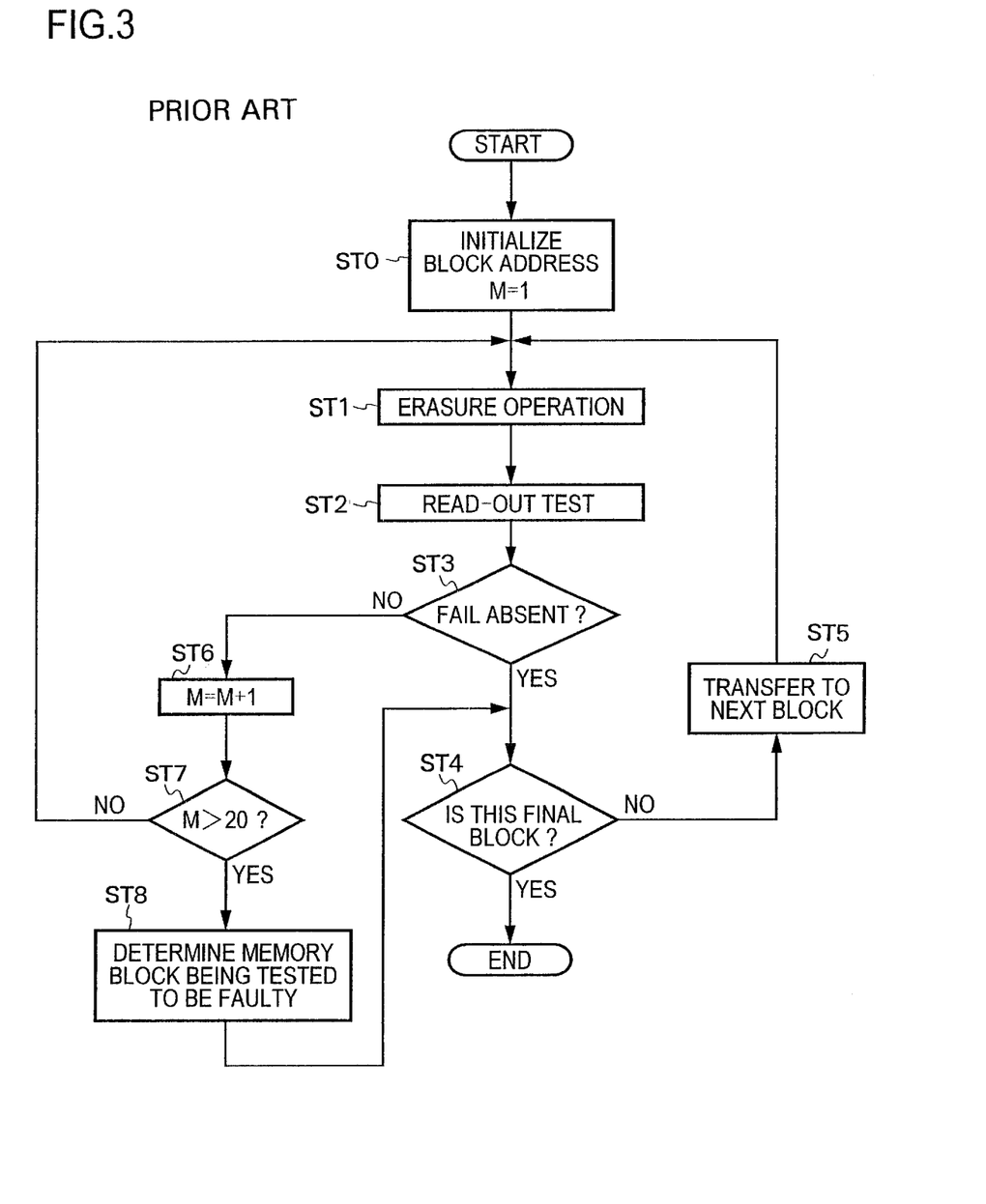
FIG. 3 is a flow chart illustrating the operation of the generated pattern sequence controller shown in FIG. 2.

FIG. 3 schematically illustrates a processing procedure followed by the sequence controller 122. At step SP0, a variable M is set to 1 and the address of a memory block under test (which may be hereafter simply refereed to as "block") is initialized. At next step SP1, the pattern generator 12 (see FIG. 1) is caused to apply an erasure pulse to the block under test, thus conducting an erasure operation. At step SP2, the pattern generator 12 is caused to conduct a read-out test from the block. The read-out test takes place from the leading address to the final address of the memory block.

At step SP3, a determination is rendered as to whether or not a "fail" has occurred (or if there is an unerased memory cell) during the read-out test. If no "fail" occurs, a determination is rendered at step SP4 as to whether this memory block is the final memory block. If it is, the procedure is completed. If it is not, the procedure goes to step SP5 which prepares for the transfer to the testing of the next following memory block, thus returning to step SP1 where the testing of the next memory block is initiated.

In the event the occurrence of a "fail" is determined at step SP3 (or if fail information latched in the fail latch 121 is found), the procedure branches to step SP6 where the variable M, which determines a maximum number of times the erasure operation and the read-out test are repeated, is incremented by one. At step SP7, a determination is rendered as to whether the variable M has exceeded a preset number of times, which is chosen to be "20" in the example shown. If the variable M is less than 20, the procedure returns to step SP1, thus again conducting the erasure operation and the read-out test upon the same memory block. When the repetition exceeds 20, M>20 is satisfied, whereby a determination is rendered at step SP8 that the memory block being tested is "fail", subsequently transferring to step SP4. The counting of the variable M takes place within the sequence controller 122.

In this manner, the sequence controller 122 of the prior art is structured such that it is only capable of repeating the erasure operation and the read-out test if only one "fail" occurs during the read-out test.

As described, the erasure operation and the read-out test are repeated as long as an unerased memory cell is detected according to the prior art practice, and thus it follows that a memory block or a chip containing an increased number of unerased memory cells requires an increased number of repeated erasure operations and read-out tests, disadvantageously resulting in an increased length of time for the test.

It is an object of the invention to provide a semiconductor memory testing method which is capable of significantly reducing the length of time required by the semiconductor memory testing method as used for a flash memory in which the erasure operation and the read-out test are repeated until there is no unerased memory cell.

It is another object of the invention to provide a semiconductor memory testing apparatus which is capable of significantly reducing the length of time by the semiconductor memory testing apparatus as used for a flash memory in which the erasure operation and the read-out rest are repeated until there is no unerased memory cell.

SUMMARY OF THE INVENTION

In a method according to the invention, during a read-out test in which unerased cell or cells are detected, the number of unerased cells is counted, and one of a predetermined plurality of numbers of erasure operations is selected in accordance with the number of unerased cells, and the selected number of erasure operations are consecutively conducted.

In accordance with the invention, a semiconductor memory testing apparatus including a pattern generator, a waveform shaper for translating an address signal, test pattern data and a control signal which are delivered by the pattern generator into signals of waveforms which correspond to the specification of a memory under test, and a logic comparator for comparing read-out data which is read out from the memory under test against expected values, comprises:

a fail counter counting the number of occurrences of faulty cell detection signals delivered from the logic comparator;

a presetter containing a preset reference value;

a comparator for comparing the count in the fail counter against the preset reference value in the presetter;

and a sequence controller for causing the pattern generator to conduct the erasure operation of the memory under test a plurality of times consecutively if the count in the fail counter is greater than the preset reference value in the presetter and for causing the pattern generator to conduct the erasure operation of the memory under test a plurality of times which is less than the first mentioned plurality of times if the count in the fail counter is less than the preset reference value.

DESCRIPTION OF EMBODIMENTS

Figure 4:
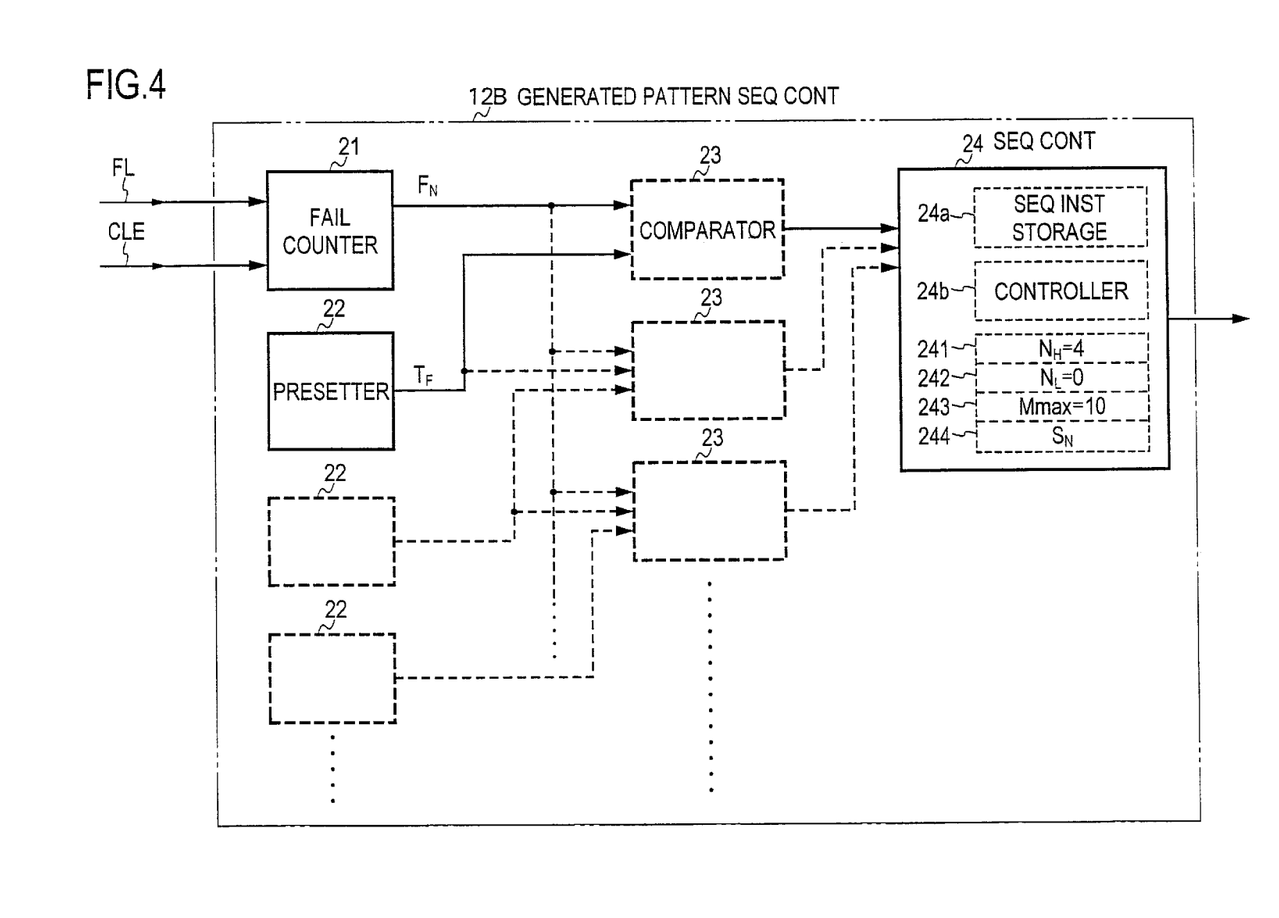
FIG. 4 is a block diagram illustrating the arrangement of an essential part of an apparatus according to an embodiment of the present invention.

Several embodiments of the present invention will now be described. The general functional arrangement of the semiconductor memory testing apparatus according to the invention in several embodiments thereof are generally similar to that shown in FIG. 1, for example. However, according to the invention, the arrangement of a generated pattern sequence controller 12A which is included in a pattern generator 12 is distinct from the prior art. The functional arrangement of the generated pattern sequence controller 12A is shown in FIG. 4.

In the present embodiment, the fail latch 121 shown in FIG. 2 is replaced by a fail counter 21, which counts the number of fail signals delivered from a logic comparator 14 or the number of unerased memory cells. A presetter 22 is provided and contains a preset value $T_F$, which is compared against the count $F_N$ in the fail counter 21 in a comparator 23. A result of comparison is input to a sequence controller 24 in order to modify the sequence of patterns generated by the sequence controller 24. The sequence controller 24 has a function of determining whether the number of unerased memory cells $F_N$ is greater than or less than the preset value $T_F$ in accordance with the result of comparison which is input thereto. When the number of unerased memory cells $F_N$ is greater than the preset value $T_F$, a determination is rendered that the number of erasure operations is wanting, and hence the erasure operation is conducted consecutively a plurality of times, for example, 5 to 7 times, followed by again conducting the read-out test. The number of consecutive erasure operations is desirably chosen as large as possible consistent with the requirement that an over-erasure cannot degrade the quality of a memory under test MUT, and varies depending on the variety of the memory under test MUT.

If no unerased memory cell is detected during the read-out test, this memory block is determined to be pass (acceptable), proceeding to the testing of a next memory block. If an unerased memory cell is detected during the read-out test and the number of unerased memory cells $F_N$ is reduced below the preset value $T_F$, the erasure operation is conducted a number of times which is less than the number of consecutive erasure operations chosen for $F_N > T_F$, for example, once, followed by conducting the read-out test again. The number of erasure operations which takes place in this instance is again chosen to guarantee that no over-erasure cannot occur.

Figure 5:
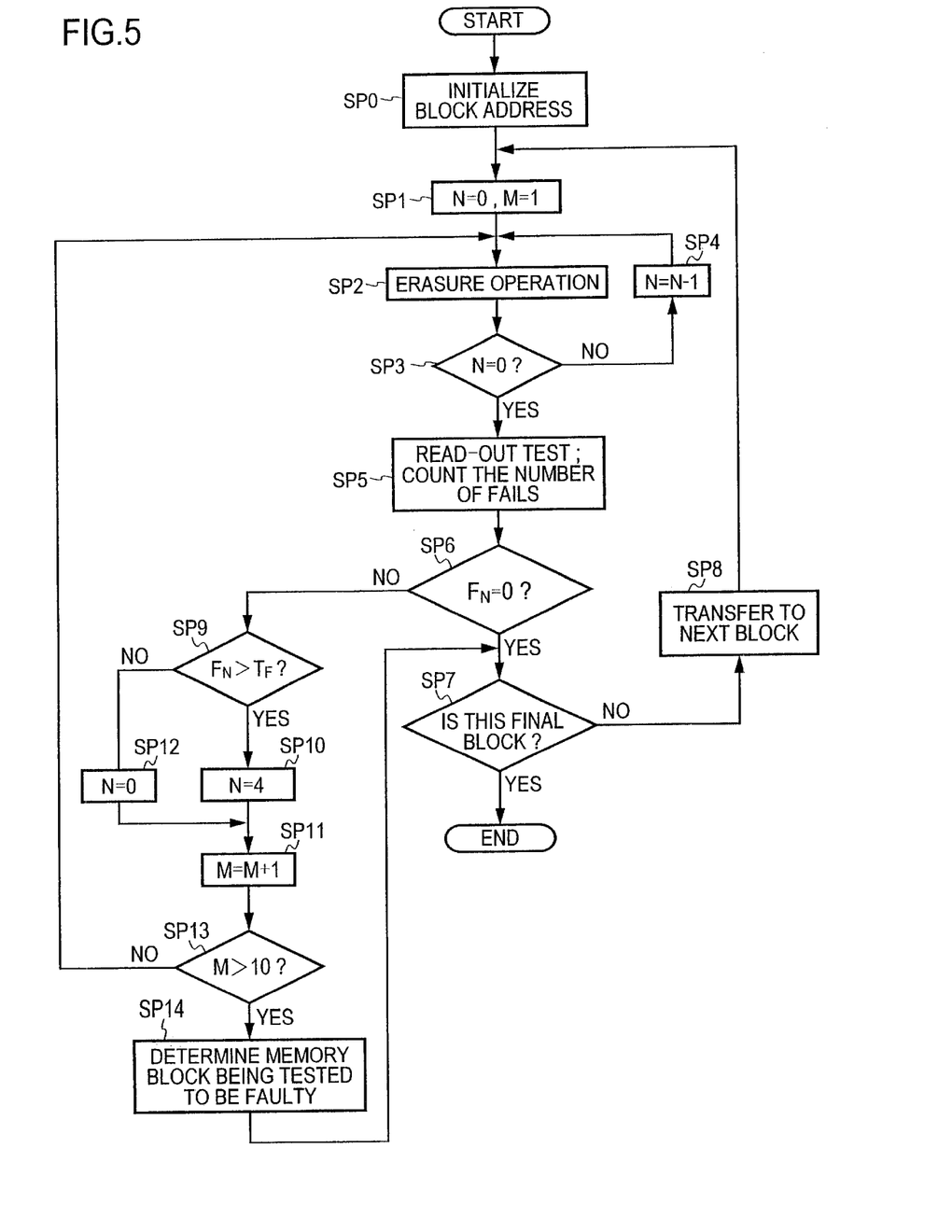
FIG. 5 is a flow chart of a method according to an embodiment of the present invention.

FIG. 5 schematically illustrates a processing procedure followed by the sequence controller 24. Again, a generated pattern sequence instruction (program) which is stored in a storage (program memory) 24a is executed by a controller 24b, thus allowing the sequence controller 24 to exercise its function.

At step SP0, the address of a memory block which is the first to be tested is specified. At step SP1, a variable N which determines the number of erasure operations (namely, the operation of applying an erasure pulse to each memory cell in the memory block of the flash memory in order to erase the stored content) is set to N=0, and the number of read-out tests M is initialized to M=1. The erasure operation is conducted at step SP2. In this example, the erasure operation is conducted only once, and the procedure then proceeds to step SP3.

At step SP3, a determination is made to see whether or not the variable N is equal to 0. If N=0, the procedure proceeds to step SP5. The read-out test is conducted at step SP5, and during the time the read-out test is continued, the fail counter 21 counts the number of fail signals delivered from the logic comparator 14 or the number of unerased memory cells.

At step SP6, a determination is rendered whether the number of fails (the number of unerased memory cells) $F_N$ is equal to "0" or greater. If the number of fails $F_N$ is equal to "0", the procedure proceeds to step SP7, and if the block being tested represents the final block, this test as well as the entire procedure is completed.

If the number of fails is not equal to "0" at step SP6, the procedure transfers to step SP9.

At step SP9, a determination is rendered to see if the number of fails $F_N$ is greater than the preset value $T_F$. Assuming that $T_F$ equal "100" is preset in the presetter 22 (see FIG. 4), if the number of fails $F_N$ is greater than "100", the procedure proceeds to step SP10 where the variable N which determines the number of erasure operations is set to "4" before proceeding to step SP11. At step SP11, the variable M which determines the number of read-out tests is incremented by one (M=M+1) before proceeding to SP13. At step SP13, a determination is rendered to see whether the variable M satisfies the inequality M>10. If the inequality is not satisfied, the procedure returns to SP2 for conducing the erasure operation. Because the variable N is "4" for the erasure operation and the inequality N=0 is not satisfied at step SP3, the procedure proceeds to step SP4 where the variable N is decremented by one, thus returning to step SP2. Accordingly, the loop including the steps SP2, SP3, SP4 is executed until the variable N becomes equal to 0, thus, conducting the erasure operation five times. Accordingly, the number of unerased memory cells in the memory block will be considerably reduced during this test as compared with a corresponding number which prevails after the single erasure operation.

After conducting the erasure operation five times, the procedure proceeds to step SP5 where the read-out test is conducted. If no unerased memory cell is detected during the read-out test, the procedure proceeds from step SP6 to step SP7. If it is found at step SP6 that this block represents the final block, the entire testing procedure is completed. If it is determined at step SP7 that this is not the final block, the procedure proceeds to step SP8 which prepares the transfer to the testing of a next memory block. Thus, the address of the next memory block is applied, and the procedure returns to step SP2, initiating the testing of the next memory block.

If it is found at step SP9 that the number of fails occurred $F_N$ is equal to or less than "100", the procedure proceeds to step SP12 where the variable N is set to "0". Accordingly, when the procedure proceeds through the steps SP11 and SP13 to return to the step SP2, the erasure operation is conducted once at SP2, and the procedure immediately transfers to SP5 where the read-out test is conducted. Subsequently, the erasure operation and the read-out test are repeated each only once until the number of fails is reduced to "0".

In the event it is determined at step SP13 that M>10, meaning that there remains unerased memory cell even after the combination of the erasure operation and the read-out test has been repeated ten or more times, the procedure proceeds to step SP14 where a determination is rendered that the memory block being tested is "fail" (faulty) before proceeding to step SP7. N=4, N=0 which are preset at steps SP10 and SP12 and the given number "10" at step SP13 are preset by externally entering $N_H$=4, $N_L$=0 and $M_{max}$=10 registers 241, 242 and 243 contained within the sequence controller 24 shown in FIG. 4 through entry means such as keyboard or through initializing program.

Since the erasure operation takes place a given number of times consecutively when the number of fails (the number of unerased memory cells) $F_N$ is greater than the preset value $T_F$, the number of unerased memory cells which will be detected during the next read-out test will be considerably reduced than after the single erasure operation. Accordingly, the number of read-out tests can be reduced in comparison to the conventional technique in which the read-out test takes place after each single erasure operation. Thus, a maximum number of read-out tests $M_{max}$ which may have been chosen to be "20" in the prior art practice, can be reduced to "10", allowing the test to be completed in the reduced length of time. If the consecutive erasure operations are used, the number thereof $N_H$ is chosen to avoid an over-erasure. When the number of unerased memory cells $F_N$ becomes equal to or less than the preset value $T_F$, the read-out test takes place after each erasure operation, thus avoiding the likelihood that the over-erasure may damage the semiconductor memory under test.

In the foregoing description, it is assumed that the test performs an erasure of each memory block by a batch operation, but the test may take place while erasing the semiconductor memory chip by a batch operation. Where the semiconductor memory comprises a single memory block, the number of memory blocks shown in FIG. 5 is reduced to 1, and thus the steps SP0, SP7 and SP8 are eliminated.

The number of erasure operations N is determined by determining at step SP9 whether the number of unerased memory cells $F_N$ is greater than the preset value $T_F$. However, the number of erasure operations N may be increased depending on the number of unerased memory cells $F_N$. The greater the number of unerased memory cells, the larger the number of erasure operations which is set up. The number of consecutive erasure operations may be selected to be 7, 5, 3, 2 or 1 in a manner corresponding to the number of fails (the number of unerased memory cells) $F_N$. Specifically, the number of erasure operations may be selected to be seven when the number of fails occurring is equal to or greater than 100; the number of erasure operations may be selected to be five when the number of fails occurring $F_N$ is greater than 70 and less than 100; the number of erasure operations may be selected to be three for the number of occurring fails $F_N$ which is greater than 50 and less than 70; the number of erasure operations may be selected to be two for the number of occurring fails $F_N$ which is greater than 30 and less than 50; and the number of erasure operations may be selected to be one for the number of occurring fails $F_N$ which is less than 30. At this end, there may be provided a plurality of presetters 22 and comparators 23, as indicated in broken lines in FIG. 4. One of the comparators 23 which corresponds to the number of fails $F_N$ in a range corresponding to the preset value may deliver an output signal. The sequence controller 24 then determines the number of erasure operations which take place before the read-out test depending on the output which one of the comparators 23 delivers.

In the foregoing description, if an unerased memory cell remains when the number of read-out tests M exceeds the given value 10, the memory block or chip (comprising only one memory block) being tested is determined to be "fail". However, this determination may be rendered when there remains an unerased memory cell when the number of erasure operations $S_N$, rather than the number of read-out tests M, exceeds a given value.

Figure 6:
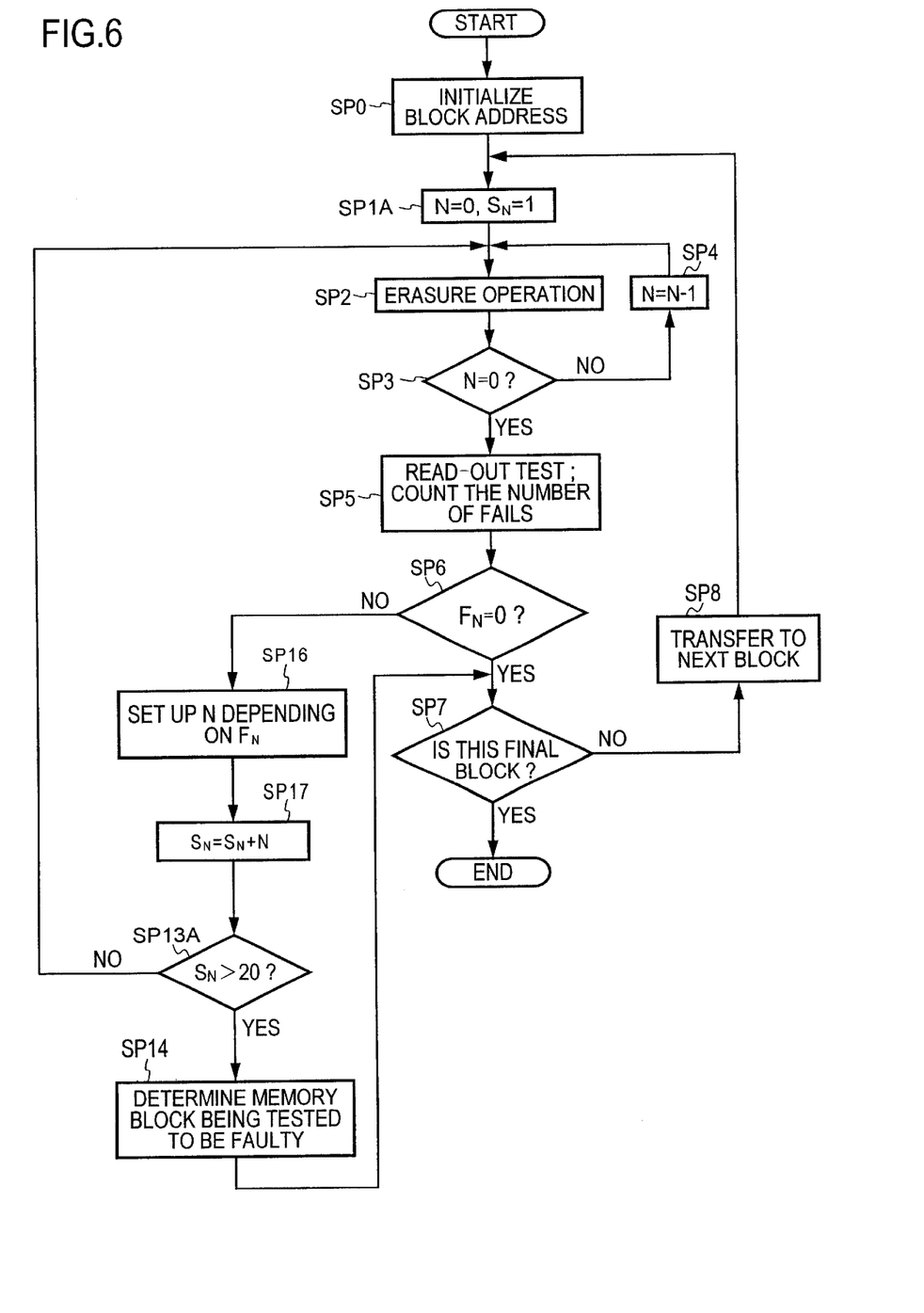
FIG. 6 is a flow chart of a method according to another embodiment of the present invention.

An exemplary processing procedure followed by the sequence controller in this instance is shown in FIG. 6. Only a difference over the processing procedure shown in FIG. 5 will be principally dealt with. Step SP0 remains similar to FIG. 5. At step SP1, N is set to 0, and a variable $S_N$, representing a total number of erasure operations, is initialized to be $S_N=1$. Steps SP2, SP3, SP5 and SP6 remains similar to corresponding steps shown in FIG. 5. At step SP6, if the number of fails is not equal to 0, the procedure transfers to step SP16 where a number of erasure operations N which depends on the number of fails $F_N$ is set up. This set-up depends on an output from a particular one of the plurality of comparators 23 shown in FIG. 4, selecting either one of 6, 4, 2, 1 and 0 for N in the example given above. At step SP17, the N which is set up in this manner is added to the total number of erasure operations $S_N$. At step SP3, an examination is made to see if a sum $S_N$ is greater than a given value of 20. If $S_N>20$ does not apply, the procedure returns to step SP2 where the erasure operation takes place consecutively a number of times corresponding to N incremented by one. If it is found at step SP13 that $S_N>20$, the procedure proceeds to step SP14. In other respects, the processing procedure of FIG. 6 remains the same as shown in FIG. 5. Either N value of 6, 4, 2, 1 or 0 which is set up at step SP16 as well as the given value of 20 used at step SP13 is previously externally loaded into registers within the sequence controller 24 shown in FIG. 4, in the similar manner as illustrated in FIG. 5. The total number of erasure operations $F_N$ is accumulated by the controller 24b.

Again, if the number of fail signals (unerased memory cells) $F_N$ which appears during the read-out test is increased, a number of consecutive erasure operations, which depend on the number of fails, take place. Accordingly, the test can be accomplished in a reduced length of time in comparison to the conventional practice in which the read-out test follows each erasure operation. In comparison to the arrangement shown in FIG. 5, the number of consecutive erasure operations is determined in a manner dependent on the number of fail signals $F_N$ and thus a number of consecutive erasure operations is controlled in a finely divided manner while avoiding an over-erasure. Thus, the test can be completed in a reduced length of time without involving a loss of the semiconductor memory under test. In the present example, a determination that the memory block being tested is "fail" is rendered under the condition that there remains an unerased memory cell, and this means that the determination is rendered depending on whether the number of erasure operations used during the test has exceeded a given number of times. Accordingly, the given number of times may be chosen to be 20 in the similar manner as in the conventional practice, but this represents the total number of erasure operations inclusive of a number of consecutive erasure operations, and thus a "fail" memory block can be detected in a reduced lengths of time as compared with the prior art.

The embodiment shown in FIG. 6 is also applicable to an erasure of a chip by a batch operation, or to a semiconductor memory (flash memory) comprising only one memory block. In this instance, steps SP0, SP7 and SP8 shown in FIG. 5 are omitted in the similar manner as an erasure of a single memory block (chip) by a batch operation.

It may be stated that the embodiment shown in FIG. 6 determines N to be one of 6, 4, 2 and 1 depending on to which one of a plurality of predetermined ranges the $F_N$ belongs in the event to it is determined at step SP9 shown in the embodiment of FIG. 5 that $F_N>T_F$.

As described, in the accordance with the invention, during the testing of a flash memory, if the number of fails occurring (the number of unerased memory cells) is greater than the preset value, a plurality of consecutive erasure operations are conducted, allowing the number of unerased memory cells to be drastically reduced by these consecutive erasure operations. Accordingly, the length of time required for the test can be significantly reduced.

While the invention has been described above in connection with the illustrated embodiments, it will be obvious to one skilled in the art that a number of changes, modifications and improvements can be made in the described embodiments without departing from the spirit and the scope of the present invention. Accordingly, the present invention is not limited to the illustrated embodiments, but is intended to cover any such changes, modification and improvements which come within the scope of the present invention defined by the appended claims.

What is claimed:

1. A semiconductor memory testing method in which a semiconducting memory comprising one or more memory blocks is subject to an erasure operation and a determination whether the semiconductor memory is acceptable or faulty is rendered depending on a result of erasure, comprising the steps of applying an erasure operation to every memory cell in one memory block of the semiconductor memory by a batch operation;

reading out the memory block of the semiconductor memory and counting a number of unerased memory cells;

and determining a number of erasure operations to be applied next in accordance with the counted number of unerased memory cells.

2. A semiconductor memory testing method according to claim 1 in which the step of determining a number of erasure operations comprises the steps of determining whether or not the counted number of unerased memory cells exceeds a given number, and determining the number of erasure operations to be a predetermined plurality of times by which the erasure operation takes place consecutively when it is determined that the counted number of unerased memory cells exceeds the given number.

3. A semiconductor memory testing method according to claim 2 in which there are three or more values for the predetermined plurality of times by which the erasure operation takes place consecutively, the step of determining the plurality of times by which the erasure operation takes place consecutively comprises determining to which one of three or more predetermined ranges corresponding to the three or more values the number of unerased memory cells belongs and choosing a higher one of the three or more values for the greater number of unerased memory cells.

4. A semiconductor memory testing method according to claim 2, further comprising the step of determining a number of erasure operations to be one for a result of determination that the number of unerased memory cells is equal to or less than the given value.

5. A semiconductor memory testing method according to claim 2 in which the number of consecutive erasure operations is chosen to be high consistent with avoiding an over-erasure of the semiconductor memory.

6. A semiconductor memory testing method according to claim 2, further comprising the steps of determining a memory block being tested to be acceptable if the counted number of unerased memory cells is equal to 0;

and in the event of the counted number of unerased memory cells which is not equal to 0, repeating the steps of determining the number of erasure operations, erasing the memory block and reading out the memory block;

and determining a memory block being tested to be faulty if the number of repetitions exceeds a given value.

7. A semiconductor memory testing method according to claim 2, further comprising the steps of determining a memory block being tested to be acceptable if the counted number of unerased memory cells is equal to 0;

if the counted number of unerased memory cell is not equal to 0, repeating the steps of determining the number of erasure operations, erasing the memory block and reading out the memory block;

and determining a memory block being tested to be faulty when a total number of erasure operations during the repetitions exceeds a given value.

8. A semiconductor memory testing method according to claim 3, further comprising the steps of determining a memory block being tested to be acceptable if the counted number of unerased memory cells is equal to 0;

if the counted number of unerased memory cell is not equal to 0, repeating the steps of determining the number of erasure operations, erasing the memory block and reading out the memory block;

and determining a memory block being tested to be faulty when the number of repetitions exceeds a given value.

9. A semiconductor memory testing method according to claim 3, further comprising the steps of determining a memory block being tested to be acceptable if the counted number of unerased memory cells is equal to 0;

if the counted number of unerased memory cell is not equal to 0, repeating the steps of determining the number of erasure operations, erasing the memory block and reading out the memory block;

and determining a memory block being tested to be faulty when the total number of erasure operations during the repetitions exceeds a given value.

10. A semiconductor memory testing apparatus in which a semiconductor memory comprising one or more memory blocks is subject to an erasure operation and a determination is rendered whether a semiconductor memory is acceptable or faulty depending on a result of erasure, comprising a pattern generator for generating an address signal, erasure data, a control signal and expected value data;

a waveform shaper for translating the address signal, the erasure data and the control signal into signals of waveforms which correspond to the specification of the semiconductor memory for application to the semiconductor memory;

a logic comparator for comparing read-out data which is read out from the semiconductor memory against the expected value to produce an unerased memory cell signal in response to a mismatch therebetween;

a fail counter for counting the number of unerased memory cell signals occurring;

a presetter having a preset reference value to be used as a criterion;

a comparator for comparing the count in the fail counter against the preset value in the presetter;

and a sequence controller receiving an output from the comparator and for causing the pattern generator to conduct an erasure operation of the semiconductor memory a plurality or times consecutively when the count is greater than the preset value and for causing the pattern generator to conduct an erasure operation of the semiconductor memory once when the count is less than the preset value.

11. A semiconductor memory testing apparatus according to claim 10, in which a plurality of presetters contain a plurality of mutually different preset values, further including a plurality of comparators each comparing the count against each preset value in each presetter, the comparators delivering their outputs to the sequence controller, the sequence controller causing a number of consecutive erasure operations to be conducted, the number of consecuting erasure operations being chosen from a predetermined plurality of numbers, which are each associated with the plurality of presetters such that a higher number of consecutive erasure operations is chosen in a manner corresponding to a higher preset value in the presetter.

12. A semiconductor memory testing apparatus according to claim 10, in which the sequence controller comprises means for determining whether or not the count is equal to 0 and for delivering a signal indicating that the memory block being tested is being acceptable, when the count is equal to 0 and means responsive to the determination that the count is not equal to 0 by determining if the number of comparisons made by the comparator exceeds a given value, and when the given value is not exceeded, allowing the test to be continued and for delivering a signal indicating that the memory block being tested is faulty when the given value is exceeded.

13. A semiconductor memory testing apparatus according to claim 10, in which the sequence controller comprises means for determining whether or not the count is equal to 0 and for delivering a signal indicating that the memory block being tested is acceptable if the count is equal to 0, and means responsive to the determination that the count is not equal to 0 to determine whether or not the total number of erasure operations has exceeded a given value, allowing the test to be continued if the given value is not exceed, but delivering a signal indicating that the memory block being tested is faulty when the given value is exceeded.

* * * * *